(12) United States Patent
Partin-Vaisband et al.

(10) Patent No.: US 12,725,037 B2
(45) Date of Patent: Sep. 1, 2026

(54) SYNTHETIC DATA FOR 2D PATHFINDING

(71) Applicant: THE BOARD OF TRUSTEES OF THE UNIVERSITY OF ILLINOIS, Urbana, IL (US)

(72) Inventors: Inna Partin-Vaisband, Urbana, IL (US); Dmitry Utyamishev, Urbana, IL (US)

(73) Assignee: THE BOARD OF TRUSTEES OF THE UNIVERSITY OF ILLINOIS Urbana (US), Urbana, IL (US)

( * ) Notice: Subject to any disclaimer, the term of this patent is extended or adjusted under 35 U.S.C. 154(b) by 808 days.

(21) Appl. No.: 18/065,053

(22) Filed: Dec. 13, 2022

(65) Prior Publication Data

US 2023/0186087 A1 Jun. 15, 2023

Related U.S. Application Data

(60) Provisional application No. 63/289,062, filed on Dec. 13, 2021.

(51) Int. Cl.

| | |
|---|---|
| ***G06F 30/394*** | (2020.01) |
| ***G06F 30/27*** | (2020.01) |
| ***G06N 3/0475*** | (2023.01) |
| ***G06N 3/08*** | (2023.01) |
| ***G06N 3/094*** | (2023.01) |

(52) U.S. Cl.

CPC .............. *G06N 3/08* (2013.01); *G06F 30/27* (2020.01); *G06F 30/394* (2020.01)

(58) Field of Classification Search

CPC .......... G06N 3/08; G06N 3/0475; G06N 3/09; G06N 3/092; G06N 3/094; G06F 30/27; G06F 30/394

See application file for complete search history.

(56) References Cited

U.S. PATENT DOCUMENTS

| | | | | |
|---|---|---|---|---|
| 8,788,995 | B1 | 7/2014 | Kumar et al. | |
| 10,534,883 | B1 | 1/2020 | Bai et al. | |
| 10,846,453 | B1 | 11/2020 | Castle | |
| 11,346,764 | B2 * | 5/2022 | Chou | G06N 3/0464 |
| 11,674,883 | B2 * | 6/2023 | Chou | G01N 1/2813 435/287.2 |
| 11,842,136 | B2 * | 12/2023 | Chouba | G06F 30/394 |
| 2007/0256045 | A1 * | 11/2007 | Lin | G06F 30/394 716/135 |
| 2022/0067524 | A1 * | 3/2022 | Mathaikutty | G06N 5/04 |
| 2022/0114440 | A1 * | 4/2022 | Dong | G06F 9/544 |

FOREIGN PATENT DOCUMENTS

KR 20190141787 A 12/2019

OTHER PUBLICATIONS

A Deep Reinforcement Learning Approach for Global Routing, Jaiguang Liao et al, Nov. 25, 2019 (doi.org/10.1115/1.4045044).

(Continued)

*Primary Examiner* — Nghia M Doan

(74) *Attorney, Agent, or Firm* — Valauskas Corder LLC

(57) ABSTRACT

Synthetically built training sets that can be used for neural network-based routing are set forth. Training datasets constructed in accordance with the principles herein are very fast, and can be used to generate a large, robust training set by a suitable router.

13 Claims, 4 Drawing Sheets

(56) References Cited

OTHER PUBLICATIONS

A stochastic evolution algorithm based 2D VLSI global router, Sadiq M. Sait et al, Integration, vol. 53, Mar. 2016, pp. 115-125 (doi.org/10.1016/j.vlsi.2015.12.007).
Accurate Prediction of Detailed Routing Congestion using Supervised Data Learning, Zhongdong Qi et al, Dec. 4, 2014, Computer Science, 2014 IEEE 32nd International Conference (10.1109/ICCD.2014.6974668).
Multiterminal Pathfinding in Practical VLSI Systems with Deep Neural Networks. Utyasmishev, Dmitry & Partin-Vaisband, Inna. Oct. 13, 2022 (doi.org/10.1145/3564930).
Late Breaking Results: Parallelizing Net Routing with cGANs, Utyasmishev, Dmitry & Partin-Vaisband, Inna. Dec. 9, 2021 (doi.org/10.1109/DAC18074.2021.9586319).

* cited by examiner

Joinable along the highlighted edge

Detached along the highlighted edge

Invalid along the highlighted edge

SYNTHETIC DATA FOR 2D PATHFINDING

CROSS-REFERENCE TO RELATED APPLICATIONS

This application claims the benefit of U.S. Provisional Application No. 63/289,062 filed Dec. 13, 2021 and incorporated herein by reference in the entirety.

TECHNICAL FIELD

The present disclosure relates to machine learning. More specifically, the disclosure relates to methods for generating data for training machine learning routers.

BACKGROUND

Global routing problems appear in many fields, such as GPS, communications, and chip design to name a few. Known solutions are not neural network based. Attempts to use neural networks thus far have not succeeded in complex high-resolution problems due to unavailability of training data.

Multiterminal pathfinding in presence of obstacles, or obstacle-avoiding rectilinear Steiner minimum tree construction (OARSMT) is a task of finding an optimal (e.g., shortest) path between two or more placed terminals. While being computationally hard, this is one of the fundamental navigation problems, required in a wide range of applications, from mobile robot path planning, navigation, wayfinding, and tracking to routing wires in printed circuit boards (PCBs) and integrated circuits (ICs). Multiterminal pathfinding in presence of obstacles plays an important role in electronic design automation (EDA) algorithms, such as global routing and placement.

Furthermore, recent trends in machine learning (ML) based EDA require an ML inspired revision of the underlying EDA algorithms. For example, the reinforcement learning solution used in state-of-the-art Google placement methodology relies on solving instances of pathfinding problems to train the reward generation model for each design layout. Thus, efficient pathfinding is critical for certain EDA tools and many other applications, ranging from route planning to routing billions of components in high-end nanoelectronics systems.

Generating routes (aka pathfinding) in a constrained 2D space is algorithmically complex (NP-complete) problem. Due to the excessively large search space, modern multiterminal pathfinding tasks cannot be optimally solved in reasonable time. To mitigate the computational complexity of pathfinding, existing solvers use approximation heuristics, producing sub-optimal solutions in reasonable time. The traditional deterministic pathfinding approaches typically have a multiterminal pathfinding task decomposed into multiple two-terminal shortest path tasks and these simpler tasks solved individually.

While machine learning (ML) pathfinders have a great potential to speed up by orders of magnitude the pathfinding process, state-of-the-art pathfinders remain deterministic, slow, and non-parallelizable. A primary bottleneck for ML pathfinder is the lack of robust, sufficiently large dataset of routed 2D samples to train machine learning models. While generating a large synthetic dataset of unrouted samples is possible, routing these samples with existing approaches is infeasible.

What is needed is synthetic training data and a method for generating this data for supervised ML pathfinding.

SUMMARY

In accordance with the principles herein a methodology, a set of algorithms for generating synthetic, robustly routed data for training machine learning routers, and an exemplary dataset generated thereby are set forth.

Datasets generated in accordance with the principles herein can use an exemplary model set forth herein. Other suitable models for generating the datasets in accordance with the principles herein are contemplated as well.

An exemplary model set forth herein provides a set of systematic methods for generating (in a reasonable time and with traditional computational resources) a dataset of synthetic, robustly routed 2D samples. The robustly routed samples of any size can be generated. This methodology enables, for the first time, generating training dataset for developing ML pathfinding approaches.

In accordance with the principles herein, an exemplary synthetic dataset for pathfinding applications can comprise a synthetic dataset generated via an algorithm via small, existing routed circuits and join them together to generate high resolution, complex obstacle-avoiding multi-pin routed circuit. The synthetic dataset can capture a variety of real-world routing characteristics which allows neural networks to be trained on this dataset. The system can be implemented using a suitable parallel processing system such as a graphics processing unit (GPU), tensor processing unit (TPU), or other suitable system.

An exemplary system comprising the synthetic datasets in accordance with the principles herein can further comprise components configured to generate joinable and detached and valid bitmap images for the synthetic dataset. The system can further comprise repeatable merges of the joinable and detached images to form a high resolution, complex global synthetic dataset.

A synthetic dataset herein can be configured to capture the similarities of the real circuits in terms of the spread of the pins and obstacles and routing characteristics.

An exemplary method of generating complex global pathfinding training datasets can comprise the steps of generating small bitmaps; joining the small bitmaps to generate a complex global pathfinding dataset of placed bitmaps. The method can further comprise the step of repeatedly improving the resolution to generate a training sample from the pathfinding dataset. The method can further comprise the step of resolving any unprocessed space adjacent to placed bitmaps.

More specifically, a synthetic dataset for pathfinding applications comprises small, existing routed circuits generated by an algorithm (e.g., optimal algorithm), wherein the small, existing routed circuits are joined together to produce a high resolution, complex obstacle-avoiding multi-pin routed circuit. The algorithm generates within a rectangular bitmap a large set of net routing, wherein each tile of the rectangular bitmap comprises at least one terminal or a net segment placed on a perimeter of the rectangular bitmap. Then, two or more rectangular bitmaps are joined via two edge net segments to obtain a larger bitmap, wherein the larger bitmap comprises a valid grouping of routed nets with smaller bitmaps being rotated and flipped as needed. Lastly, the algorithm determines whether the joined bitmaps are a valid grouping if it does not exceed a maximum layout resolution as provided by a target training resolution.

Joinable and detached bitmap images are generated for the synthetic dataset. These are small optimally routed bitmaps that are consequently used for generating the large training dataset according to the algorithm. Merges of the joinable and detached bitmap images are repeated to form a high resolution, complex global synthetic dataset.

The attributes and advantages will be further understood and appreciated with reference to the accompanying drawings. The described embodiments are to be considered in all respects only as illustrative and not restrictive, and the scope is not limited to the foregoing description. Those of skill in the art will recognize changes, substitutions and other modifications that will nonetheless come within the scope and range of the claims.

BRIEF DESCRIPTION OF DRAWINGS

The preferred embodiments are described in conjunction with the attached figures.

DETAILED DESCRIPTION

Synthetically built training sets that can be used for neural network-based routing are set forth. Training datasets constructed in accordance with the principles herein are very fast, and can be used to generate a large, robust training set by a suitable router. A multiterminal obstacle-avoiding pathfinding approach inspired by deep image learning is further described in *Multiterminal Pathfinding in Practical VLSI Systems with Deep Neural Networks*. Utyasmishev, Dmitry & Partin-Vaisband, Inna.13 Oct. 2022; doi.org/10.1145/3564930, incorporated by reference, and *Late Breaking Results: Parallelizing Net Routing with cGANs*, Utyasmishev, Dmitry & Partin-Vaisband, Inna. 9 Dec. 2021; doi.org/10.1109/DAC18074.2021.9586319, incorporated by reference.

The principles herein provide a set of systematic methods for generating, in a reasonable time and with traditional computational resources, a dataset of synthetic, realistically routed 2D dataset samples. The realistically routed samples of any size can be generated. This methodology and resulting datasets enable for the first time, generating and using synthetic training datasets for developing ML pathfinding approaches.

Figure 1A:
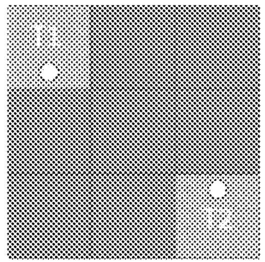
FIG. 1A illustrates a block diagram of a partitioned circuit with two terminals, T1 and T2, that require connection.
Figure 1A:
Figure 1B:
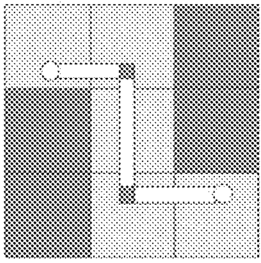
FIG. 1B illustrates a block diagram of the global routing of a preferred pathfinding solution to connecting the two terminals, T1 and T2, of FIG. 1A.
Figure 2A:
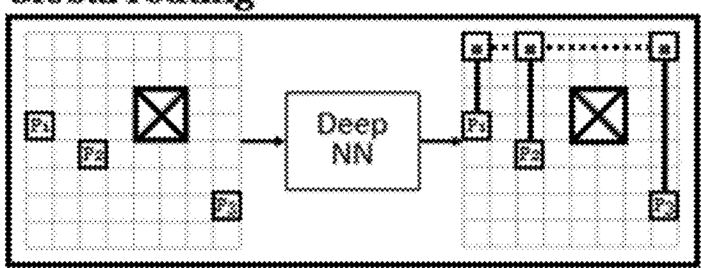
FIG. 2A illustrates a global routing problem directed to missing net pixels that are reconstructed in the output bitmap.
Figure 2B:
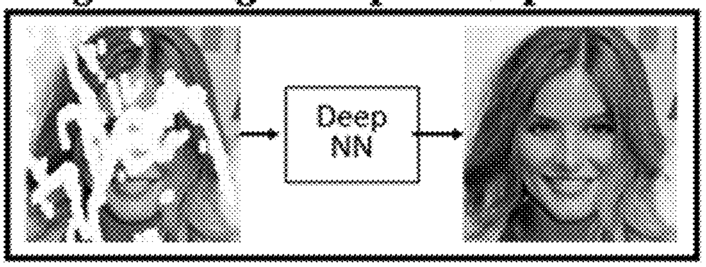
FIG. 2B illustrates missing pixels from an input bitmap that are reconstructed in the output bitmap.

A typical routed two-terminal net is illustrated in FIG. 1. The terminals that need to be connected are shown in FIG. 1A and the preferred pathfinding solution is shown in FIG. 1B. FIG. 2 illustrates a potential usage/application to utilize the dataset generated with the proposed method in order to reducing routing to an image manipulation problem. In the global routing problem shown in FIG. 2A, the net pixels are missing. In the imaging problem shown in FIG. 2B, pixels are missing from the input bitmap. In both problems, the missing parts are reconstructed in the output bitmap.

Figure 3A:
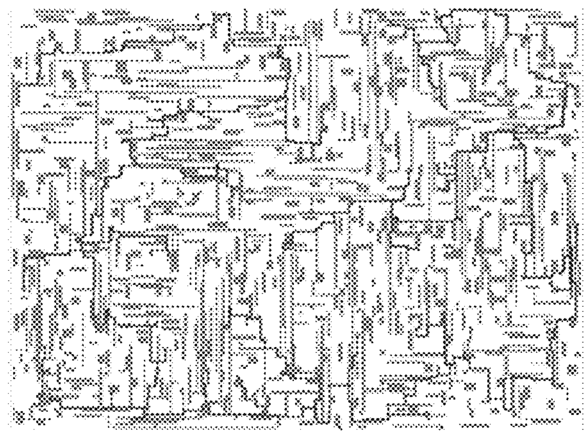
FIG. 3A illustrates a single routed net of a typical routing benchmark.
Figure 3B:
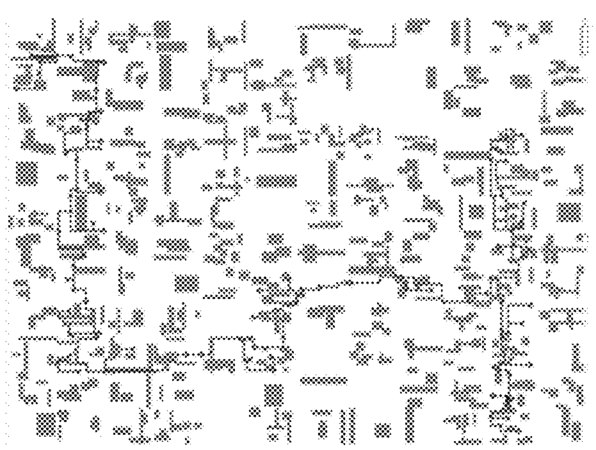
FIG. 3B illustrates a single routed net with similar resolution and number of terminals as FIG. 3A.

A synthetic dataset herein can be configured to capture the similarities of the real circuits in terms of the spread of the pins and obstacles and routing characteristics. FIG. 3 shows a realistic synthetic net and a true net at the same level of complexity. FIG. 3A and FIG. 3B illustrate a single routed net with similar resolution and number of terminals with FIG. 3A showing a typical routing benchmark, and FIG. 3B showing a net generated with the proposed approach.

Figure 4:
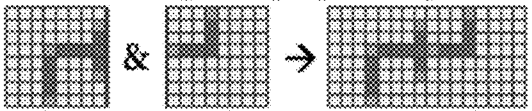
FIG. 4 illustrates a block diagram of joinable and detachable bitmap merges.
Figure 4:
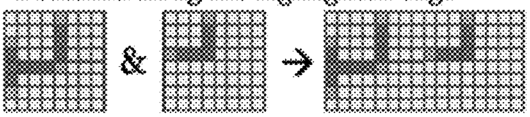
Figure 4:

FIG. 4 illustrates examples of joinable and detached bitmap merges. Initially, a large amount of small (e.g., 8×8 to 128×128) easy-to-route samples are routed with existing exhaustive methods. The probability for a terminal to be placed along a bitmap boundary is controlled, determining the number of boundary terminals in each bitmap. Other than that, terminals and obstacles are placed randomly. For each boundary of a routed bitmap, the lists of all the "joinable" and "detached" bitmaps are constructed. Two bitmaps are joinable along a boundary if a single continuous non-looping net can be generated by aligning the bitmaps along the boundary. Otherwise, the bitmaps are detached or generate a loop.

To approach a routing challenge as a supervised ML task, the ML model needs to be trained on a set of exemplary routed reference nets (i.e., training samples and the corresponding true labels). A deep learning model requires a significant amount of training samples. Effective and fast generation of pathfinding tasks and the corresponding, state-of-the-art like pathfinding solutions is, therefore, a primary concern. While a straightforward generation of random pathfinding tasks is feasible, routing complex nets with existing EDA tools is computationally prohibitive and impractical for training purposes. Thus, the reference multiterminal routed nets are synthetically generated herein.

The key idea is merging several low resolution, realistic paths into a higher resolution robust realistic path. First, a large set of pathfinding tasks is generated within small (i.e., 8×8 to 128×128) rectangular bitmaps. Each small bitmap comprises at least one terminal or a net segment placed on the bitmap perimeter (i.e., edge terminal or edge net segment). These small bitmaps are realistically routed with exhaustive pathfinding methods. A valid merge of routed nets into a longer, more complex net within a larger bitmap is accomplished by joining two bitmaps via two edge terminals/net segments. For that purpose, smaller bitmaps can be rotated and flipped as needed. The merging process continues until the resulted bitmap reaches the target layout resolution. Examples of bitmap merges are shown in FIG. 5.

Figures 5A, 5B, 5C, 5D, 5E:
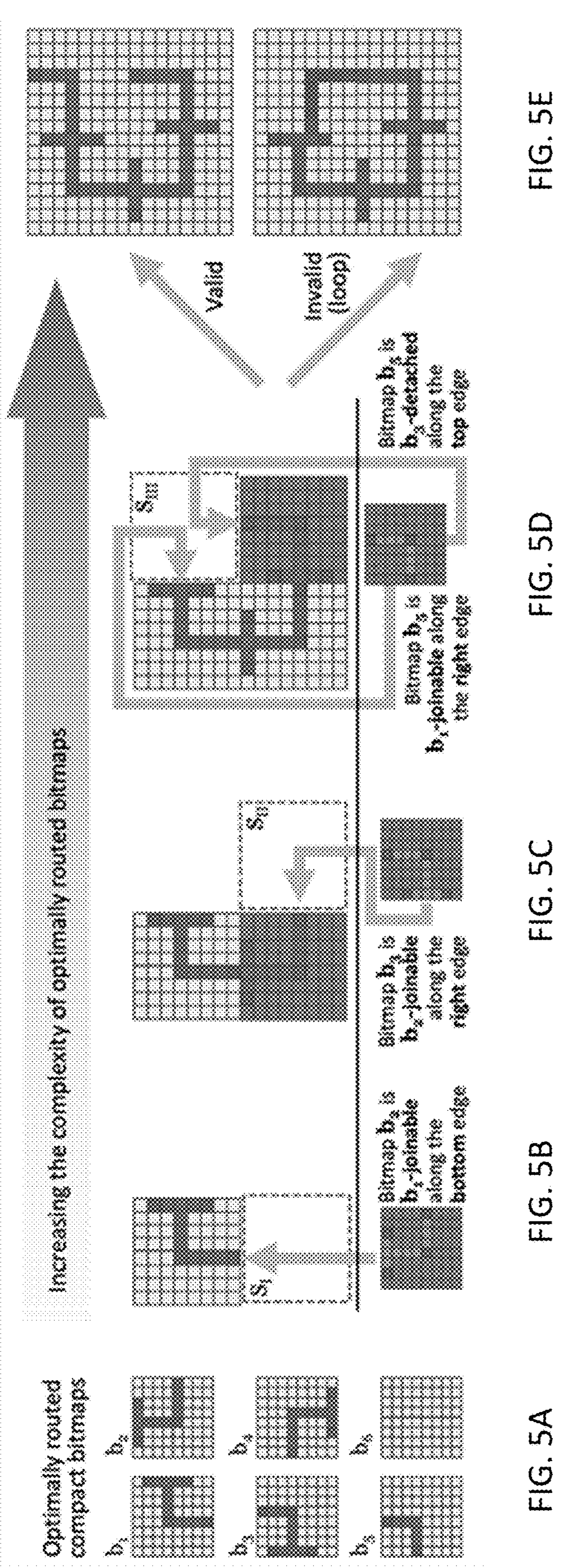
FIG. 5A illustrates a block diagram of a set of low-resolution optimally routed bitmaps.
FIG. 5B illustrates a block diagram of randomly selected and placed bitmaps.
FIG. 5C illustrates a block diagram of randomly selected and placed bitmaps.
FIG. 5D illustrates a block diagram of randomly selected and placed bitmaps.
FIG. 5E illustrates a block diagram of an optimally routed valid bitmap and an invalid net.

Specifically, FIG. 5 illustrates the proposed flow for generating a training sample of optimally routed high-resolution net. In FIG. 5A, a set of low-resolution optimally routed bitmaps are shown. In FIG. 5B, bitmap b1 is randomly selected and placed. Given the single bitmap, b1, adjacent to the unprocessed space SI, the bitmap, b2, is randomly selected from the list of b1-joinable bitmaps and placed in SI along the bottom edge of b1. In FIG. 5C, the single bitmap, b2, adjacent to the unprocessed space SII, the bitmap, b3, is randomly selected from the list of b2-joinable bitmaps and placed in SII along the right edge of b2. In FIG. 5D, given the two bitmaps, b1 and b3, adjacent to the unprocessed space SIII, the bitmap, b5, is randomly selected from the intersection of the b1-joinable and b3-detached bitmaps and placed in SIII along the right edge of b1 and top edge of b3. As a result, an optimally routed valid bitmap with 4× resolution is generated as shown in the top of FIG. 5E. Alternatively, selecting the last bitmap from the intersection of the b1- and b3-joinable bitmaps results in an invalid circular net as shown in the bottom of FIG. 5E. Thus, bitmaps are always selected from the intersection of a joinable and detached lists.

While the net generated by merging two optimally routed nets is not necessarily optimal (i.e., new, shorter paths can exist between terminals of merged bitmaps), note that the optimality of the dataset is not required for training an ML pathfinding model to optimally route unseen nets. Based on the experimental results (see documents incorporated by reference), the conditional generative adversarial network (cGAN) model trained on suboptimal synthetic nets routes unseen nets with state-of-the-art wirelength.

Figures 6A, 6B:
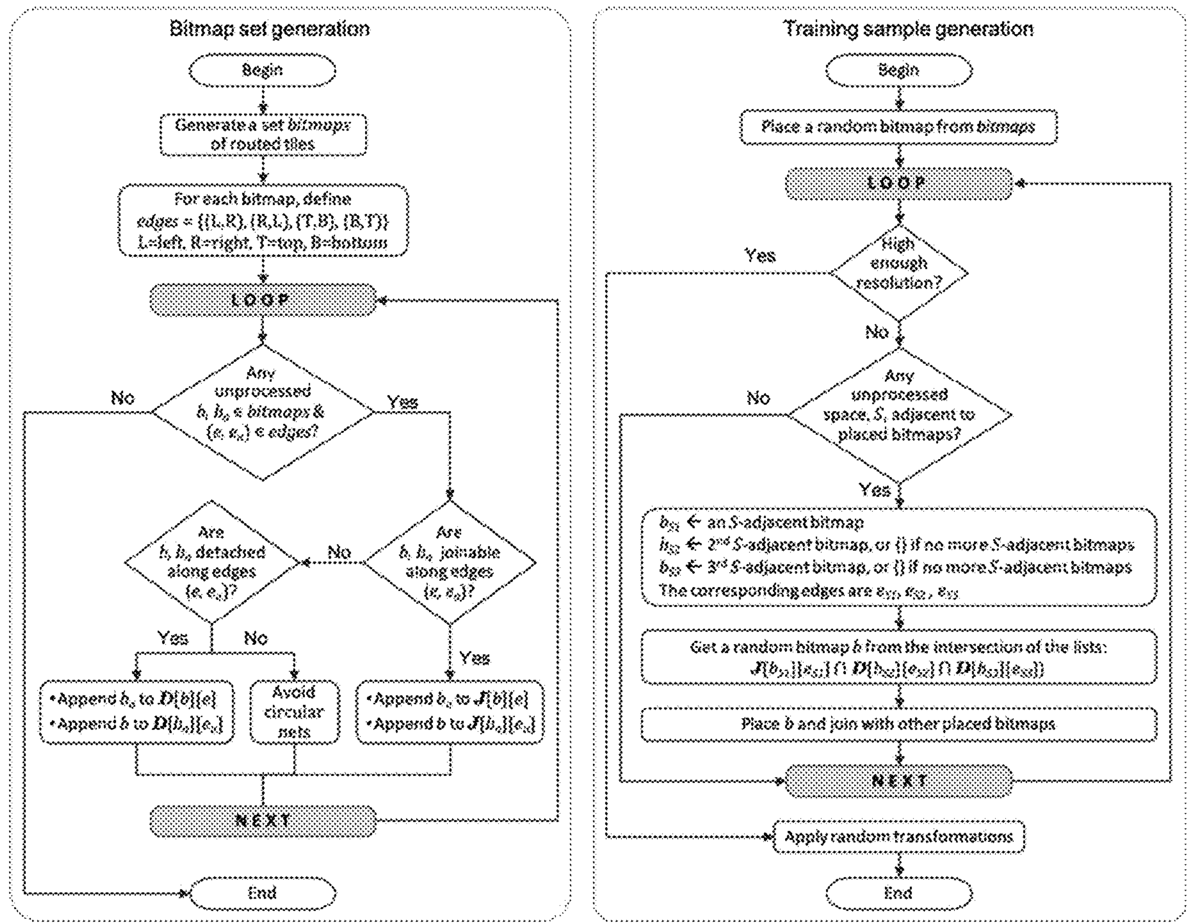
FIG. 6A illustrates a flow chart for generating small bitmaps that are optimally routed.
FIG. 6B illustrates a flow chart for generating complex, optimally routed training datasets by joining the optimally routed small bitmaps of FIG. 6A.

The flow diagram of the training set generation is shown in FIG. 6. FIG. 6A illustrates the flow for generating small bitmaps. These bitmaps are optimally routed with optimal algorithm shown in FIG. 6B. Specifically, FIG. 6B illustrates the flow for generating complex, optimally routed training dataset by joining the optimally routed small bitmaps.

At each iteration, a bitmap is randomly selected from a pool of bitmaps and matched with another random bitmap from the pool for a valid merging. Note that bitmaps generated in this manner tend to exhibit statistically significant difference in net density at the edge tiles, increasing the risk of model overfitting during training. Thus, each net resulted from a valid merging is shifted in a random direction, as shown in FIG. 5.

The grouped and shifted bitmap is added to the pool and the process continues to the next iteration. A model trained on the resulted training set is expected to capture broad net routing rules in presence of obstacles. To capture a system-specific obstacle constraints, another fine-tuned dataset is generated. Samples in this set are generated in the following manner. Tiles from a typical layout are randomly sampled and combined into a small bitmap (e.g., 128×128). The bitmap is utilized to generate thousands of routing tasks with numerous randomly placed terminals, which are routed with conventional methods. Shown by the experimental results, including the fine-tuned data within the training set significantly increases the saturation speed of the trained model.

While the disclosure is susceptible to various modifications and alternative forms, specific exemplary embodiments have been shown by way of example in the drawings and have been described in detail. It should be understood, however, that there is no intent to limit the disclosure to the embodiments disclosed, but on the contrary, the intention is to cover all modifications, equivalents, and alternatives falling within the scope of the disclosure as defined by the appended claims.

The invention claimed is:

1. A synthetic dataset for pathfinding applications, the synthetic dataset configured to capture the similarities of a real circuit, comprising routed circuits generated by a computer-executable program stored on a computer readable storage media, when executed, the computer program generating the routed circuits via steps comprising:

generating within a rectangular bitmap a large set of net routing, wherein each tile of the rectangular bitmap comprises at least one terminal or a net segment placed on a perimeter of the rectangular bitmap;

joining two or more rectangular bitmaps via two edge net segments to obtain a larger bitmap, wherein the larger bitmap comprises a valid grouping of routed nets with smaller bitmaps being rotated and flipped as needed;

determining whether the joined bitmaps are a valid grouping if it does not exceed a maximum layout resolution as provided by a target training resolution; and using the valid grouping of joined bitmaps to produce the routed circuits;

a high resolution, complex obstacle-avoiding multi-pin routed circuit comprising the routed circuits.

2. The synthetic dataset of claim 1, wherein the synthetic dataset captures a variety of realistic routing characteristics allowing neural networks to be trained on this dataset.

3. A machined learning (ML) based pathfinding system network for generating routes comprising:

a parallel processing system implemented by using a graphics processing unit (GPU), a tensor processing unit (TPU), or other computing resource suitable for parallel processing, a ML pathfinding model running on the parallel processing system, the synthetic dataset for pathfinding applications of claim 1, wherein the ML pathfinding model is trained on a training dataset generated from the synthetic dataset, and the ML pathfinding model, once being trained, is applied to route unseen nets.

4. The system according to claim 3, wherein the computer-executable program, when executed, generates the routed circuits via steps further comprises generating joinable and detached bitmap images for the synthetic dataset, as the training dataset generated from the synthetic dataset.

5. The system of claim 4, wherein the computer-executable program, when executed, generates the routed circuits via steps further comprises repeatable merges of joinable and detached bitmap images to form a high resolution, complex global synthetic dataset.

6. The system according to claim 3, the ML pathfinding model is a conditional generative adversarial network (CGAN) model.

7. The system according to claim 6, wherein the training dataset generated from the synthetic dataset for pathfinding applications is a set of suboptimal synthetic nets.

8. AA method performed by data processing apparatus for generating a synthetic dataset capturing the similarities of real circuits in terms of the spread of the pins and obstacles and routing characteristics thereof, comprising:

obtaining a plurality of low-resolution optimally routed small bitmaps (LRSBs) each of which is a bitmap of an existing routed circuit, and each of which comprises at least one terminal of a net segment placed on the bitmap perimeter, obtaining a target layout resolution, selecting and merging two or more bitmaps from the plurality of LRSBs into a resulted bitmap, continuing the selecting and merging step until the resulted bitmap reaches the target layout resolution, at which point, the resulted bitmap is a bitmap of a valid complex obstacle-avoiding multi-pin routed circuit, outputting the resulted bitmap as one datapoint of the synthetic dataset.

9. The method of claim 8, wherein the selecting and merging further comprises:

randomly selecting and placing a bitmap b1 from the plurality of LRSBs, wherein b1 is adjacent to an unprocessed space SI, randomly selecting a bitmap b2 from a list of b1's joinable bitmaps, and placing b2 in SI along the right edge of b1, wherein b2 is adjacent to an unprocessed space SII, randomly selecting a bitmap b3 from a list of b2's joinable bitmaps, and placing b3 in SII along the right edge of b2, wherein the bitmaps b1 and b3 are adjacent to an unprocessed space SIII, randomly selecting a bitmap b5 from an intersection of bitmap b1's joinable bitmaps and bitmap b3's detached bitmaps, and placing b5 in SIII along the right edge of b1 and the top edge of b3, outputting the b1, b2, SI SIL, b3, SILL, and b5 in their respective placings to the resulted bitmap.

10. A method performed by data processing apparatus of generating a complex global pathfinding training dataset and using the complex global pathfinding training dataset comprising:

generating a plurality of small bitmaps, each small bitmap comprises at least one terminal or a net segment placed on the small bitmap perimeter;

joining the plurality of small bitmaps via edge terminals and/or net segments into a longer, more complex net within a larger bitmap to generate the complex global pathfinding training dataset of placed bitmaps;

training a machine learning (ML) based pathfinding model based on the complex global pathfinding training dataset; and applying the ML based pathfinding model in pathfinding applications.

11. The method of claim 10, further comprising the step of:

repeatedly improving the resolution the larger bitmap to generate a training sample from the complex global pathfinding training dataset.

12. The method of claim 11, further comprising the step of:

resolving any unprocessed space adjacent to placed bitmaps.

13. The method of claim 10, further comprising the steps of:

generating within a rectangular bitmap a large set of net routing, wherein each tile of the rectangular bitmap comprises at least one terminal or a net segment placed on a perimeter of the rectangular bitmap;

joining two or more rectangular bitmaps via two edge net segments to obtain a larger bitmap, wherein the larger bitmap comprises a valid grouping of routed nets with smaller bitmaps being rotated and flipped as needed; and determining whether the joined bitmaps are a valid grouping if it does not exceed a maximum layout resolution as provided by a target training resolution.

* * * * *